United States Patent [19]
Oliva et al.

[11] Patent Number: 5,117,173
[45] Date of Patent: May 26, 1992

[54] INTEGRATED BATTERY CYCLE COUNTER

[75] Inventors: Elio J. Oliva, Pembroke Pines; Vernon Meadows, Coral Springs; Lilbert S. Hawkins, III, Sunrise, all of Fla.

[73] Assignee: Motorola, Inc., Schaumburg, Ill.

[21] Appl. No.: 658,811

[22] Filed: Feb. 22, 1991

[51] Int. Cl.$^5$ ............................................ H01M 10/44
[52] U.S. Cl. ........................................ 320/21; 320/13; 320/43; 320/48
[58] Field of Search .................. 320/21, 43, 48, 44; 324/426, 427; 340/636

[56] References Cited

U.S. PATENT DOCUMENTS

| | | | |
|---|---|---|---|
| 3,971,980 | 7/1976 | Jungfer et al. | 320/48 X |
| 4,170,752 | 10/1979 | Busch et al. | 320/21 X |
| 4,399,396 | 8/1983 | Hase | 320/43 |
| 4,536,757 | 8/1985 | Ijntema | 340/636 |
| 4,663,587 | 5/1987 | MacKenzie | 324/141 |
| 4,709,202 | 11/1987 | Koenck et al. | 320/43 |
| 4,734,635 | 3/1988 | Theobald | 320/13 |
| 4,800,336 | 1/1989 | Mikami et al. | 320/48 X |
| 4,820,966 | 4/1989 | Fridman | 320/32 |
| 4,871,956 | 10/1989 | Barrella | 320/13 |
| 4,885,523 | 12/1989 | Koenck | 320/21 |
| 4,912,392 | 3/1990 | Faulkner | 320/44 |
| 4,962,347 | 10/1990 | Burroughs et al. | 320/48 |
| 4,977,393 | 12/1990 | Arnold et al. | 340/636 |

*Primary Examiner*—Steven L. Stephan
*Assistant Examiner*—Kristine Peckman
*Attorney, Agent, or Firm*—Pablo Meles

[57] ABSTRACT

A battery cycle counter comprises a rechargeable battery having supply and charger contacts, a circuit for providing an input signal when the rechargeable battery is being charged, and a counter powered by the battery and responsive to the input signal which increments a cycle count. The counter has input and output ports. An analog output circuit coupled to the counter output ports provides a unique analog output signal indicative of said cycle count.

27 Claims, 4 Drawing Sheets 5,117,173

INTEGRATED BATTERY CYCLE COUNTER

TECHNICAL FIELD

This invention relates generally to batteries and chargers, and more specifically to a circuit within a rechargeable battery system that allows a user to accurately determine how many times the battery has been cycled.

BACKGROUND

Present methods of monitoring rechargeable batteries are cumbersome, requiring microprocessors, digital signalling and additional costs not necessarily required for a battery cycle counter. Many of the present battery conditioners available on the market that attempt to monitor certain battery parameters require external power sources and/or extra connections between the battery conditioner/charger and the rechargeable battery, further adding to the cost of the battery itself and the overall product. For example, extra connections, contacts, and tooling for their arrangement are required for serial or parallel data lines between the battery monitoring devices and batteries. Furthermore, charge/conditioners are not designed to detect when a battery has been "cycled." The market lacks a simple, low cost, robust, and reliable battery cycle counter.

A need for a cheap method of accurately tracking the number of times a rechargeable battery is cycled definitely exists. For instance, large municipal users of two-way portable radios frequently recharge batteries more than once a day. At that rate, the battery may fail before the battery life expectancy in terms of time. Thus, with a battery cycle counter, the user and manufacturer can determine more accurately the life of the battery in terms of actual usage. Therefore, a method of battery cycle counting without an undue expense added to the battery or battery pack would be desirable.

SUMMARY OF THE INVENTION

Accordingly, a battery cycle counter comprises a rechargeable battery having supply and charger contacts, a circuit for providing an input signal when the rechargeable battery is being charged, and a counter powered by the battery and responsive to the input signal which increments a cycle count The counter has input and output ports. An analog output circuit coupled to the counter output ports provides a unique analog output signal indicative of said cycle count.

DETAILED DESCRIPTION OF THE PREFERRED EMBODIMENT

Figure 1:
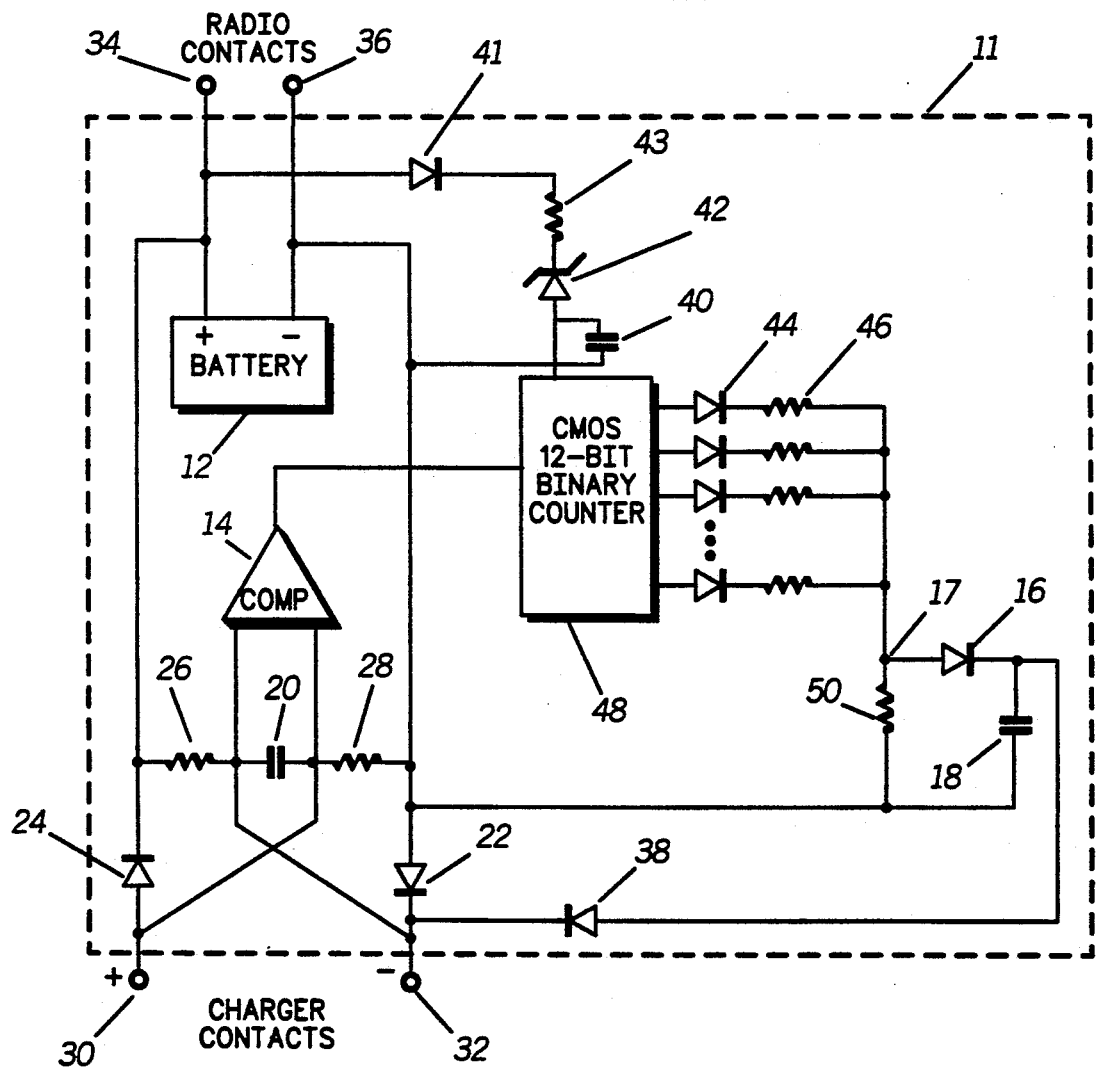
FIG. 1 is a schematic diagram of a battery cycle counter in accordance with the present invention.

Referring to FIG. 1, there is shown a schematic diagram of a battery cycle counter 10 in accordance with the present invention. Preferably, the battery cycle counter 10 comprises a rechargeable battery (or battery cells) 12 within a housing 11 having a counter means 48 having input and output ports and powered preferably by the battery 12 (or optionally by a separate button cell or a power source such as a supercapacitor within the housing 11 (not shown)), a circuit means 14 for providing an input signal to the counter means 48, and an analog output means (44 and 46) coupled to the output of the counter 48 for providing a unique output signal indicative of a signal count. Optionally, the present invention could include a storage means (16, 18 and 50) for maintaining the unique output signal indicative of the signal count for an extended period of time. The battery 12 preferably comprises a rechargeable battery such as a nickel cadmium, lead acid, or lithium ion battery having positive and negative charger contacts (30 and 32 respectively) and positive and negative supply or radio contacts (34 and 36 respectively). The circuit means (14) preferably comprises a comparator that provides a pulse input into the counter means 48. The counter means preferably comprises a CMOS 12-bit Binary Counter having at least 12 outputs. Of course, other counters are within contemplation of the present invention. The analog output means coupled to the outputs of the counter means 48 preferably comprises a bank of diodes (44) followed by a bank of resistor (46). The analog output means could comprise of essentially any components that would provide a unique current or voltage at point 17 or between point 17 and ground (32). The storage means preferably comprises a resistor 50, a diode 16, and a capacitor 18. Capacitor 18 is used to retain the voltage value across resistor 50 (minus the small voltage drop across the diode 16) in case the power to the counter 48 fails. Capacitor 18 should be a relatively large, low leakage capacitor. It is contemplated within the scope of the invention that a high quality supercapacitor having low leakage characteristics would retain the voltage value longer than a conventional capacitor.

Operationally, battery cycle counter 10 simply detects when the battery is inserted into a charger and then increments the cycle count by one. Optionally, the battery cycle counter 10 has an adjustable delay circuit coupled to the charger contacts to prevent falsing or the incorrect incrementing of the cycle count if the battery is repeatedly inserted and removed from the charger before being fully charged or the power to the battery charger momentarily fails. The delay circuit comprises of a capacitor 20 coupled to the inputs of the comparator 14 and a resistor network (26 and 28) coupled to the ends of the capacitor 20. The amount of the delay is dependant upon the values of resistors 26 and 28 and the value of the capacitor 20. Once the charger voltage is removed from the battery for a longer period than the delay period, the delay will elapse and the circuit will be ready to cycle count again when the charger voltage is reapplied to the battery. When the battery is not in a charger, resistors 26 and 28 allow the battery to charge capacitor 20 to establish a voltage across the comparator inputs. The resistors 26 and 28 combine with the high input impedance of the comparator 14 to minimize the current drain on the battery as it charges the capacitor 20. As soon as the battery is placed into the charger, a reverse voltage is applied across capacitor 20 causing it to discharging through the charger and then charge in the reverse polarity. This reversal of voltage across capacitor 20 causes a reversal of voltage across the comparator inputs, which causes a sharp, clean, input pulse at the comparator (14) output into the counter input. This pulse is used to clock the CMOS counter (48) and thus incrementing the cycle count.

The 12 outputs of the CMOS counter 48 are connected to the bank of 12 diodes 44 to prevent a high counter output from grounding itself into a low counter output since the outputs are tied together. The bank of 12 resistors or resistor network 46 coupled to the bank of diodes (44) are used to generate a unique voltage across the charge resistor 50 for each of the 4096 (or $2^{12}$) possible outputs of the 12-Bit CMOS counter. When an individual counter output is high, there is a voltage drop across its corresponding resistor, increasing the voltage drop across charge resistor 50. When the counter output is low, there is no voltage drop across its corresponding resistor and its corresponding diode will block any sink current.

Figure 2:
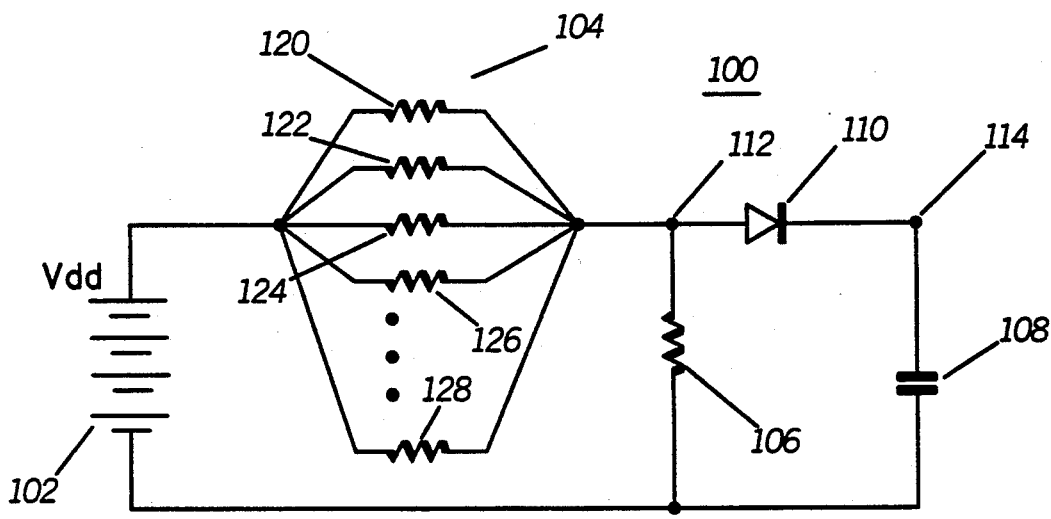
FIG. 2 is a circuit diagram of a resistive network in accordance with the present invention.

FIG. 2 provides a simplified example of how a resistive network as embodied in FIG. 1 would work within contemplation of the present invention. Since the present invention provides a unique output based on the radios between resistors, implementation of the counter and analog output into an integrated circuit becomes easier. The voltage source 102 simulates the counter output, while the bank of resistors 104 (including resistors 120, 122, 124, 126, and 128) correspond to the blank of resistors 44 in FIG. 1. If the counter 48 had five high outputs corresponding to the 5 (of 12) resistors shown in FIG. 2, then resistors 120, 122, 124, 126, and 128 would be connected in parallel to create a unique resistance, which in turn is connected in series to the charge resistor 106 (corresponding to resistor 50 of FIG. 1). This creates a unique voltage value at points 112 and 114. The diode 110 and the capacitor 108 (corresponding to diode 16 and capacitor 18 of FIG. 1) serve as safety backups should the battery die or the counter become disabled. Capacitor 110 should be fairly large, and preferably of low leakage type. The capacitor should have a voltage equal to the voltage across resistor 106 minus the voltage drop due to the diode 110. As previously discussed, even if the counter outputs are disabled, the capacitor 108 will store the voltage representative of the last cycle count displayed by the counter for a period of time. The diode 110 is biased in the direction shown to prevent the capacitor 108 from discharging once charged.

Referring once again to FIG. 1, zener diode 42 and capacitor 40 also serve as safety backups. The zener diode 42 is designed to keep the Vdd of the CMOS counter 48 within rated limits. A diode 41 is designed to keep capacitor 40 from discharging and resistor 43 is designed to limit short circuit current. The diode 41 is preferably a Schottky type diode in order to provide only a 0.3V drop across its junction. If the battery voltage should drop below some predetermined minimum level, then the zener diode 42 will turn off and the CMOS counter 48 will run off the capacitor 40. Again, capacitor 40 preferably would have similar characteristics preferably found in capacitor 18.

Figure 3:
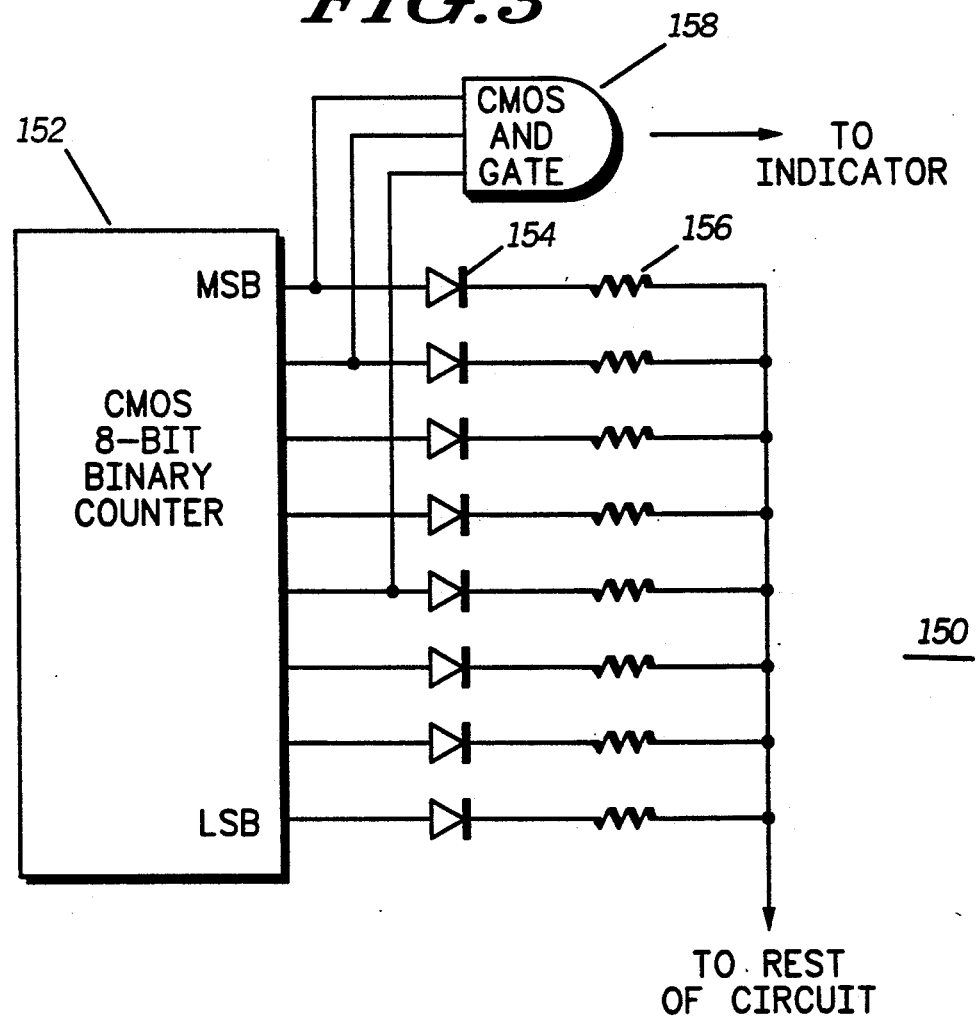
FIG. 3 is a schematic diagram of an alternative embodiment of the battery cycle counter with means for displaying the output in accordance with the present invention.

The cycle count can be determined by reading the voltage between the negative battery terminal 36 on the supply side and the negative battery terminal 32 on the charge side. In other words, the cycle count is stored as a voltage across the negative charger and the negative radio contact of the battery. No additional connections or openings in the battery housing 11 would be required. A circuit used to read the battery cycles will be disclosed later in the detailed description in reference to FIGS. 4 and 5. But other simple battery monitoring devices are within contemplation of the present invention. For instance, referring to FIG. 3, a small window or transparent plastic (not shown) could be molded into the battery housing to provide a "visual cycle indicator." The user could look into this window and see if one of two (or more) different colors were activated, indicating the battery's cycle status. For example, red could indicate that the battery has exceeded its "expected" cycle life, while green could indicate that the battery is within its expected cycle life. The circuit 150 of FIG. 3 could easily be implemented with the present invention. In this example, for simplicity, an eight-bit Binary Counter 152 is used instead of a 12 Bit Counter. Circuit 150 has a bank of 8 diodes 154 and a bank of 8 resistors 156. Preferably, a CMOS logic AND gate 158 could be hardwired to the outputs of the counter 152 to detect a count of 200 (or $2^7 + 2^6 + 2^3$). Thus, when a predetermined count is reached (i.e., 200), the CMOS logic AND gate 158 would generate a high voltage signal, which could be used to send a current through a material that changes colors when excited or heated by a current. Likewise, this high voltage signal could be used to excite a liquid crystal display (LCD) or a light emitting diode (LED). Of course, other indicating means could easily be adapted to circuit 150 and would be within contemplation of the present invention.

Figure 4:
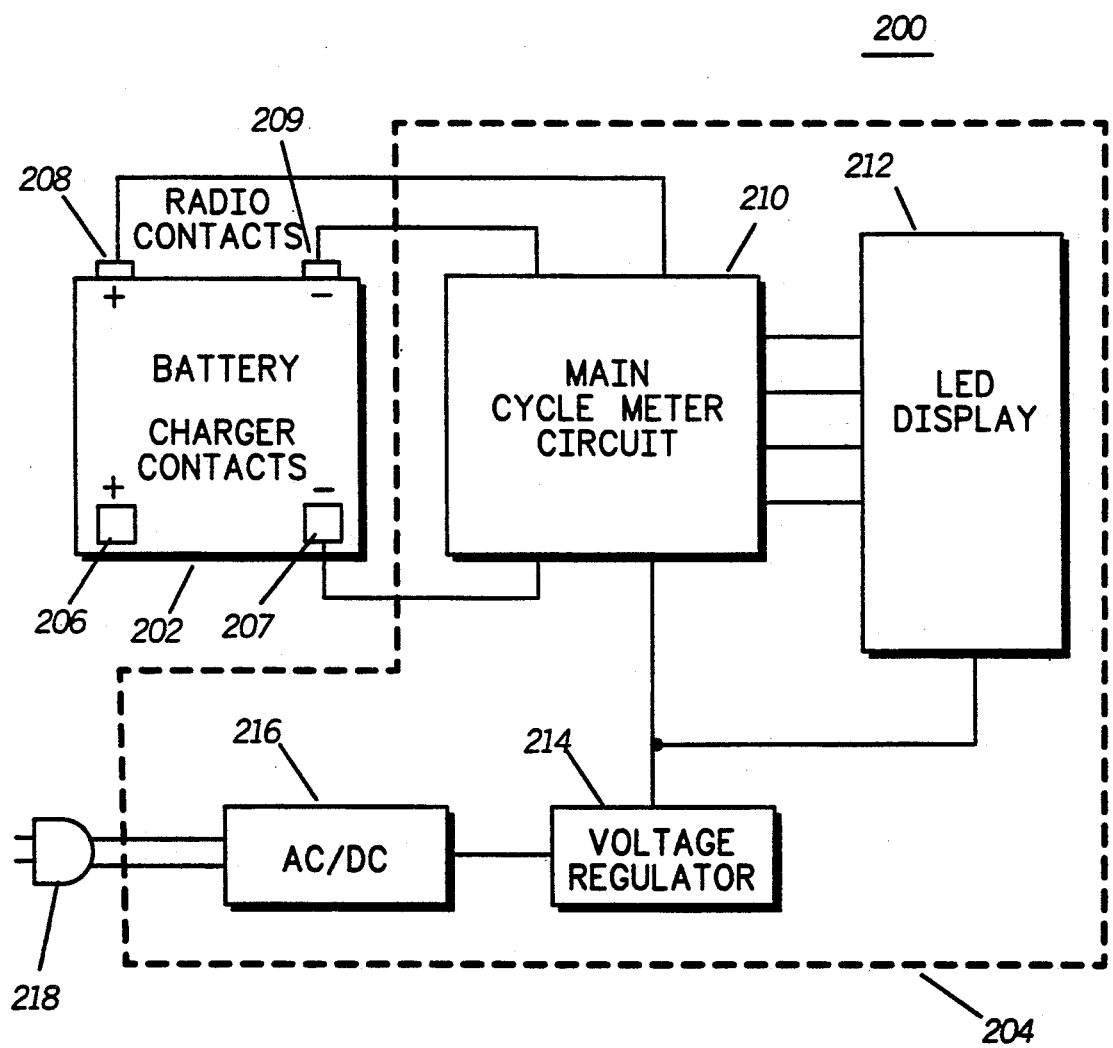
FIG. 4 is a block diagram of the battery cycle counter meter in accordance with the present invention.

Referring to FIG. 4, there is shown a battery cycle metering or monitoring system 200 which comprises of a battery 202 and a battery cycle meter or monitor 204. Battery 202 has similar circuitry within the battery as previously discussed in reference to the battery cycle counter 10 of FIG. 1. The battery 202, likewise, comprises positive and negative radio or supply contacts (208 and 209 respectively) and positive and negative charger contacts (206 and 207 respectively.) The battery cycle meter 204 preferably comprises main cycle meter circuitry 210, LED display circuitry 212, and a power source 218. In the preferred embodiment, the power source 218 would be the standard 110 volt alternating current. Thus, an AC to DC convertor 216 and voltage regulator 214 would be required as is known in the art. Optionally, the battery cycle meter 204 could run off its own power source (such as a battery), allowing the cycle meter to be used as a portable device.

Operationally, the battery cycle meter 204 is designed to read the voltage across the battery's negative contacts (207 and 209) and translate it into a number on an alphanumeric LED display. In order to work properly, three connections are preferably needed. The negative radio and charger contacts (209 and 207), as previously discussed, read the count voltage stored in the battery 202. The positive and negative radio contacts (208 and 209) are used to read the battery voltage and determine if it is below the minimum voltage required to drive the internal count circuitry.

Figure 5:
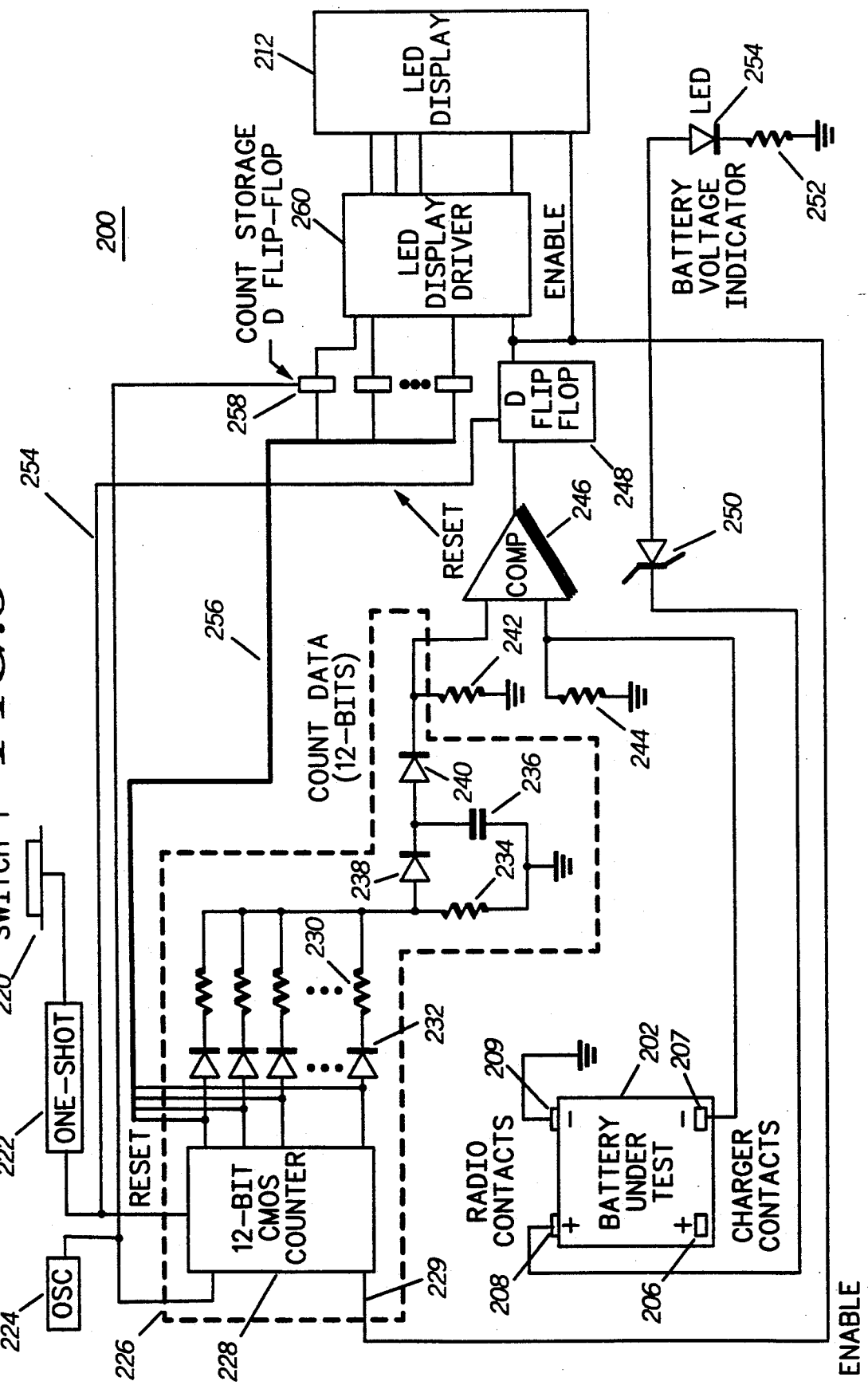
FIG. 5 a more detailed schematic block diagram of FIG. 4.

Referring to FIG. 5, there is shown a more detailed schematic diagram of the battery cycle monitoring system 200 in accordance with the present invention. Please note that the circuitry in the system 200 consists of simple logic devices and a few discrete components which provides for a simple and inexpensive design to test and manufacture. Also note that this system is primarily analog and not digitally based, further reducing the cost in this instance.

The battery cycle monitoring system 200 is designed to compare the count voltage in the battery 202 produced by the mirror circuit 226. The mirror circuit is essentially identical to a portion of the cycle count circuit found in FIG. 1. The mirror circuit 226 preferably comprises of a 12-Bit CMOS counter 228 having a bank of diodes 232 and a bank of resistors 230 coupled to its output. The mirror circuit further includes the resistor 234 coupled to the diodes 238 and 240 and the capacitor 236. When the count voltage in the battery equals the count voltage produced by the mirror circuit, the comparator 246 will set a D flip-flop 248. The D flip-flop 248, in turn, enables the LED display 212 and the LED display driver 260. The display driver 260, once enabled, will display the count stored in the bank of 12 D flip-flops (258), which are fed by the counter 228 of the mirror circuit 226 via a 12-bit count data line 256. Optionally, the LED display driver 260 may contain latched inputs which would make the bank of 12 D flip-flops 258 superfluous.

The counter 228 of the mirror circuit 226 is disabled using the same D flip-flop 248 that enabled the LED display 212 and driver 260. This is done to prevent the counter 228 from advancing beyond the correct count. To prevent race conditions, an oscillator 224 (coupled to the counter 228 and the bank of D flip-flops 258) preferably has its frequency set by the worst case delay time needed for the output of the enable D flip-flop 248 to reach the enable pin 229 of the mirror circuit counter 228. The same oscillator that clocks the counter 228 also clocks the bank of D flip-flops 258, but all the actual clock connections from each D flip-flop have been omitted for clarity. It is understood that one ordinarily skilled in the art would be able to make the necessary clock connections.

The switch 220 is a mechanical switch that is closed when the battery is inserted into the cycle meter. When the switch 220 is closed, a one-shot 222 provides a signal to activate the reset in the counter 228 and discharges capacitor 236, resetting the capacitor for the next charge. Therefore, each time a battery (202) is inserted into the cycle meter, the mirror circuit 226 is reset and begins counting from zero until the correct count is reached.

The LED display 212 will show the count stored in the battery 202. Additionally, the LED display 212 could also show if the battery voltage has dropped below the minimum permissible level needed to drive the cycle counter (48) in the battery pack (202). The cycle meter contains a zener diode 250 similar to the zener diode 42 in the cycle counter 10. If the battery voltage is enough to forward bias the zener diode 250, a battery voltage indicator LED (254) is activated. The battery voltage indicator preferably comprises an LED 254 coupled to a resistor 252 which is coupled to ground. When the battery voltage indicator LED (254) is activated, the user knows that the battery being tested has enough voltage to power its internal cycle counter circuitry and therefore, the cycle count being displayed is guaranteed to be accurate. Resistors 242 and 244 are provided to increase the accuracy of the cycle meter by matching the comparator inputs. Preferably, the resistors 242 and 244 would be equivalent values.

The cycle monitoring system 200 is simple and inexpensive and could be built as a separate stand alone device or integrated into another device such as a battery analyzer, conditioner, or charger. Furthermore, due to its low power consumption, the cycle monitoring system 200 could be implemented as a stand-alone programmable device running off an internal battery pack. In summary, the cycle monitoring system 200 is a low cost, low power, robustly designed innovative device that will allow battery users to keep track of how many times their batteries have been cycled.

What is claimed is:

1. A battery cycle counter, comprising:
   a rechargeable battery having supply and charger contacts;
   circuit means for providing an input signal when said rechargeable battery is being charged;
   a counter means responsive to said input signal which increments a cycle count, said counter means having input and output ports; and
   analog output means comprising a parallel impedance network coupled to said counter means output ports for providing a unique analog output signal indicative of said cycle count.

2. The battery cycle counter of claim 1, wherein said counter means, circuit means, and said analog output means are implemented into an integrated circuit.

3. The battery cycle counter of claim 1, wherein said counter means comprises a CMOS 12-Bit Binary Counter powered by said rechargeable battery and alternatively powered by a second battery.

4. The battery cycle counter of claim 1, wherein said circuit means comprises a comparator having an output and an input, said comparator output being coupled to the input port of said counter means and said comparator input being coupled to the charger contacts of said battery, said comparator further having a capacitor coupled between said input of said comparator, a first resistor coupled between the capacitor and a battery positive supply contact, and a second resistor coupled between the capacitor and a battery negative supply contact.

5. The battery cycle counter of claim 1, wherein said battery cycle counter further comprises an indicator means coupled to said output port for displaying the status of said cycle count.

6. The battery cycle counter of claim 5, wherein said indicator means comprises a liquid crystal display coupled to the output of said counter means.

7. The battery cycle counter of claim 5, wherein said indicator means comprises an electrically sensitive color changing element.

8. The battery cycle counter of claim 1, wherein said battery cycle counter is encased within a housing.

9. The battery cycle counter of claim 1, wherein said analog output means comprises a parallel resistive network coupled to the output ports of said counter means.

10. A battery cycle counter, comprising:
    A rechargeable battery having positive and negative supply and charger contacts;
    pulse input means coupled to said charger contacts for providing a pulse input signal;
    counting means coupled between said negative supply contact and said negative charger contact and responsive to said pulse input means, for counting the number of times said battery has been recharged, said counting means having at least one input port for receiving said pulse input signal and at least one output port; and
    a parallel impendance network coupled to the output ports of said counting means for providing an analog output signal indicative of the number of times said battery has been recharged.

11. The battery cycle counter of claim 10, wherein said battery cycle counter further comprises an indicator means coupled to said output port for displaying said cycle count.

12. The battery cycle counter of claim 11, wherein said pulse input means, counting means, and said parallel impedance network are implemented into an integrated circuit.

13. The battery cycle counter of claim 11, wherein said counting means comprises a CMOS 12-bit binary counter.

14. The battery cycle counter of claim 10, wherein said pulse input means comprises a comparator having input ports coupled to said charger contacts and an output port coupled to said counting means.

15. The battery cycle counter of claim 10, wherein said counting means is powered by a second battery.

16. A battery cycle meter for reading a cycle count from a battery, comprising:
   a power supply;
   a mirror counter means powered by said power supply for mirroring said cycle count provided by a battery cycle counter;
   a switch coupled to said mirror counter means, which is activated when said battery is placed in said battery cycle meter;
   a comparator circuit that switches on when said mirror counter means mirrors said cycle count;
   count data means for providing said cycle count to a display when said comparator is switched on.

17. The battery cycle meter of claim 16, wherein mirror counter means comprise a CMOS counter coupled to a resistive network.

18. The battery cycle meter of claim 16, wherein said count data means comprises data lines coupled to the outputs of said mirror counter means for providing the cycle count to a display when said comparator circuit is enabled.

19. The battery cycle meter of claim 16, wherein said comparator circuit comprises of a comparator coupled to a D flip-flop.

20. The battery cycle meter of claim 16, wherein said display comprises an LED display driver and an LED display.

21. The battery cycle meter of claim 16, wherein said battery cycle meter is a portable product.

22. The battery cycle meter of claim 16, wherein said battery cycle meter resides within a battery charger.

23. The battery cycle meter of claim 16, wherein said battery cycle meter resides within a battery analyzer.

24. A battery cycle monitoring system, comprising: in a battery assembly:
   a rechargeable battery having supply and charger contacts;
   circuit means for providing an input signal when said rechargeable battery is being charged;
   a counter means powered by said battery and responsive to said input signal which increments a cycle count, said counter means having input and output ports; and
   analog output means coupled to said counter output ports for providing a unique analog output signal indicative of said cycle count.
   in a battery assembly receiving device:
   a power supply;
   a mirror counter means for mirroring said cycle count provided by said battery;
   a comparator circuit which provides an enable signal when said mirror counter means mirrors said cycle count;
   count data means for providing said cycle count to a display when said comparator provides an enable signal.

25. The battery cycle monitoring system of claim 24, wherein said battery receiving device comprises a charger.

26. The battery cycle monitoring system of claim 24, wherein said battery receiving device comprises a battery conditioner.

27. The battery cycle monitoring system of claim 24, wherein said comparator circuit comprises a comparator coupled to a D Flip-Flop.

* * * * *